(12) United States Patent
Arussi

(10) Patent No.: US 8,351,263 B2
(45) Date of Patent: Jan. 8, 2013

(54) METHOD CIRCUIT AND SYSTEM FOR OPERATING AN ARRAY OF NON-VOLATILE MEMORY ("NVM") CELLS AND A CORRESPONDING NVM DEVICE

(75) Inventor: Aner Arussi, Alfei-Menashe (IL)

(73) Assignee: Infinite Memory Ltd., Rosh Ha Ayin (IL)

( * ) Notice: Subject to any disclaimer, the term of this patent is extended or adjusted under 35 U.S.C. 154(b) by 736 days.

(21) Appl. No.: 12/505,491

(22) Filed: Jul. 19, 2009

(65) Prior Publication Data

US 2010/0290287 A1    Nov. 18, 2010

Related U.S. Application Data

(60) Provisional application No. 61/177,307, filed on May 12, 2009.

(51) Int. Cl.
*G11C 16/04* (2006.01)

(52) U.S. Cl. ........... 365/185.11; 365/185.2; 365/185.18; 365/185.24

(58) Field of Classification Search ............. 365/185.11, 365/185.2, 185.24, 185.18
See application file for complete search history.

(56) References Cited

U.S. PATENT DOCUMENTS 6,963,505 B2 * 11/2005 Cohen ...................... 365/185.03

* cited by examiner

*Primary Examiner* — Toan Le
(74) *Attorney, Agent, or Firm* — Vladimir Sherman; Professional Patent Solutions

(57) ABSTRACT

Disclosed is a method, circuit and system for determining a Lowest Operative Threshold Voltage Level for one or more cell segments/blocks/sets of a NVM array and a corresponding device, adapted to compare substantially native state NVM cells in a block of cells against one or more reference cells/structures or offset values, and to maintain a read error count.

21 Claims, 19 Drawing Sheets

METHOD CIRCUIT AND SYSTEM FOR OPERATING AN ARRAY OF NON-VOLATILE MEMORY ("NVM") CELLS AND A CORRESPONDING NVM DEVICE

FIELD OF THE INVENTION

The present invention generally relates to the field of operating Non-Volatile Memory cells. More specifically, the present invention relates to a method, circuit and system for determining an Operative Threshold Voltage Level for one or more cell blocks/sets of a NVM array and a corresponding device.

BACKGROUND

As is well known in the art, by comparing the output of non-volatile memory (NVM) cells with a reference level, different current/voltage levels can be associated with different logical states. Accordingly, a NVM cell's current level may be correlated to the amount of charge stored in a charge storage region of the cell. Prior to the storing of any charge within a charge storage region, the cell may be referred to as "native" or in its "initial" state.

Generally, in order to determine whether an NVM cell is at a specific state, for example erased, programmed, or programmed at one of multiple possible program states within a multi-level cell ("MLC"), the cell's current level is compared to that of a reference cell whose current level is preset at a level associated with the specific state being tested for.

The initial positioning of the different reference levels is accomplished using data extracted from the NVM array during manufacturing. During the manufacturing process, after fabrication, an NVM array may be tested to determine the native current levels of each of its cells. These native current levels may then be used for the presetting of the reference levels.

While native threshold voltage distributions over an entire array may be in the order of 2V or more, the distributions across an array segment may be lower, for example 1V. Thus, establishing a lowest reference voltage to be slightly higher than the highest native threshold voltage of a specific segment within the memory array may result in either a larger or smaller 'Cycle Margin' ("CM"—The margin between the initial NVM cell level and the lowest reference level) for cells in other array segments whose NVM cells have native threshold voltages relatively lower or higher than those in the segment which was selected for the preset of the reference cell.

In order to avoid such a difference in 'Cycle Margin' for the different segments, a lowest reference voltage level for each of the array's segments may be determined. Hence, the lowest reference voltage for each segment may be determined in respect to the highest native threshold voltage of any cell within that given array segment. Still, a need remains in the field of NVM cells operation for methods, circuits and systems for determining a Lowest Operative Threshold Voltage Level for one or more cell segments/blocks/sets of a NVM array.

SUMMARY OF THE INVENTION

The present invention is a method circuit and system for operating an array of non-volatile memory ("NVM") cells and a corresponding NVM device. According to some embodiments of the present invention, voltage threshold values associated with voltage boundaries between two or more logical states may be defined for a block or set of cells based on a lowest operable threshold voltage for the block/set of cells. The lowest operable threshold voltage for the block/set of NVM cells may be correlated to the native threshold voltage distribution for the block/set, and according to some embodiments the lowest operable threshold voltage for a block/set of cells may be set at or near the threshold voltage of a cell having the highest native threshold voltage within the block/set of cells.

According to some embodiments of the present invention, the lowest operable threshold voltage level for a given block/set may define the upper threshold voltage boundary of a first logical state, and a lower threshold voltage boundary of a second logical state for the block/set may be defined by some fixed offset voltage value from the lowest operable threshold voltage level, for example 0.5V above the lowest operable threshold voltage value. An upper threshold voltage boundary of the second logical state may likewise be defined relative to the lowest operable threshold voltage ("LOTV")—for example 1.0V above the LOTV, and thus 0.5V above the lower boundary of the second logical state. According to embodiments of the present invention related to multilevel programming/read of NVM cells, lower and upper threshold voltage boundaries of third, fourth, etc. logical states may likewise be defined relative to the lowest operable threshold voltage level.

According to some embodiments of the present invention, the lowest operable Threshold Level/Boundary may be determined by reading NVM cells in the block/set of cells prior to a first programming cycle and/or after a conditioning cycle. Some or all of the cells in the block/set may be read against at least a first reference cell or structure associated with a first threshold voltage level. The first reference cell or structure may be part of a set of reference cells or structures, wherein each reference cell or structure in the set is associated with a different threshold voltage. Alternatively, the first reference cell/structure may be designed to have an adjustable threshold voltage.

A read error count may be maintained as NVM cells from the block/set of cells are read against a given reference cell/structure associated with a given threshold voltage. If, for example, the NVM cells are assumed to be at a threshold voltage level below that of the threshold voltage level of the reference cell/structure against which they are being read, for each cell in the block/set which is found to have a threshold voltage above that of the reference cell/structure (e.g. cell starts conducting after the reference cell/structure starts conducting), a read error may be recorded. If, on the other hand, the NVM cells are assumed to be at a threshold voltage level above that of the threshold voltage level of the reference cell/structure against which they are being read, for each cell in the block/set which is found to have a threshold voltage below that of the reference cell/structure (e.g. cell starts conducting before the reference cell/structure starts conducting), a read error may be recorded.

Comparing some or all of the NVM cells in a given block/set of cells, while they are in a native or conditioned state, against different reference cells/structures, coupled with a read error count, may be used to estimate or determine a lowest operable Threshold Level/Boundary for a given cell block/set. According to some embodiments of the present invention, NVM cells in the given block/set of cells may be first compared/read against a first reference cell structure having the lowest threshold voltage level from all possible threshold voltages associated with a set of reference cells, or the lowest threshold voltage achievable with an adjustable reference cell/structure. If less than some predefined number of cells (e.g. less than 5) are found to have a threshold voltage above that of the first reference cell/structure, the lowest operable Threshold Level/Boundary for that given block/set of cells may be correlated to (set at or around) the threshold voltage of the first reference structure. If, on the other hand, more than some predefined number of cells (e.g. 5 cells) from the block of cells are found to have a higher threshold voltage than the first reference cell/structure (i.e. read error count is at or above 5), the comparison/reading of NVM cells against the first reference cell/structure may be terminated, and a reference cell/structure with an incrementally higher threshold voltage may be selected for comparison reading. The process of comparing, error checking and incrementing reference structures (e.g. from lowest threshold voltage to highest threshold voltage) may be iterated until a reference cell/structure which results in an acceptable number of read errors (e.g. 5) is identified—and the threshold voltage of the identified reference cell/structure may be used to select the lowest operable Threshold Level/Boundary for the given cell block/set.

According to some embodiments of the present invention, the reference cells/structures used when determining a LOTV may be programmed by external circuitry. Once an LOTV is determined for one or blocks/sets of cells, one or more reference cells/structure may be programmed or reprogrammed based on the determined LOTV. According to some embodiments of the present invention, one set of references cells/structures may be programmed for each block, or in some cases for a set of blocks having a similar LOVT.

According to further embodiments of the present invention, a set of reference cells may be provided for an entire array of NVM cells, where the threshold voltages of the reference cells may be set as a function of substantially all the determined LOTV values for substantially all of the blocks for cells in the array—for example, a global set of reference cells may be established (i.e. programmed) based on a weighted average of the LOVT values of substantially all of the blocks of cells. According to embodiments of the present invention utilizing global reference cells/structures as described above may include a establishment of a table of (e.g. offset) values for substantially each of the blocks of cells. The value (e.g. offset value) correspond to a given block may indicate the difference between the LOVT of that given block and the LOTV based on which the global reference cells/structures were established (i.e. programmed). Thus, when the given block is operated using the global reference cells, a compensation circuit may use the value stored in the table corresponding to the block being operated in order to adjust sensing circuits and/or word-line supply circuits so as to compensate between the global reference cell/structure threshold levels and the logical state threshold boundary levels of the block being operated.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
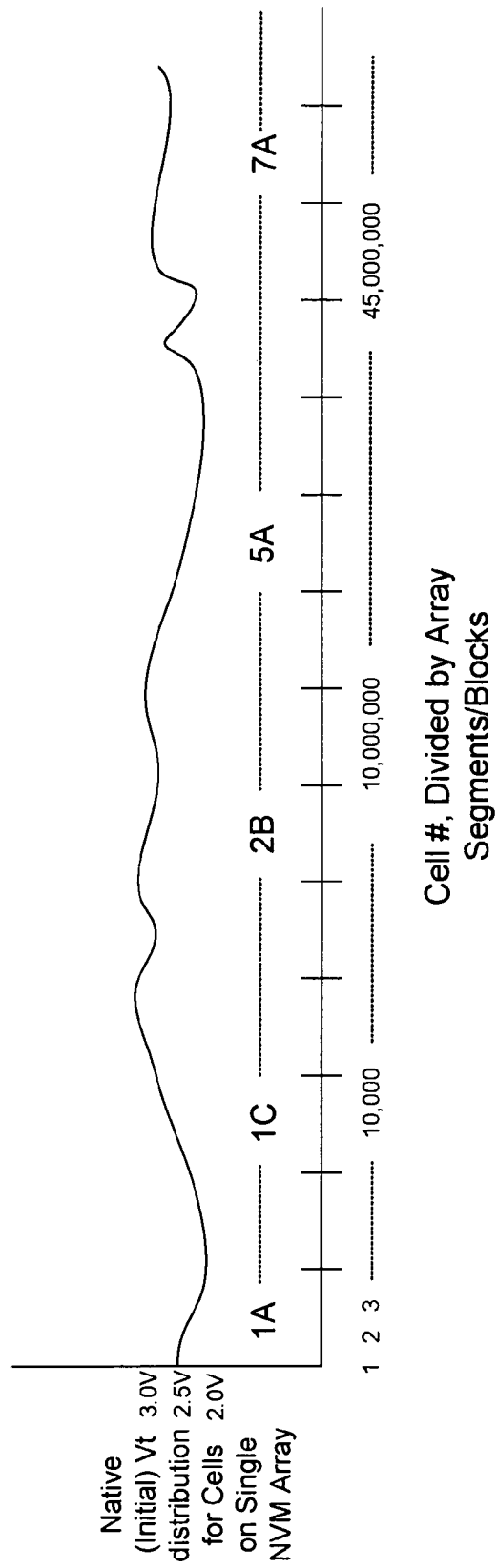
FIG. 1 is a prior art, exemplary, native threshold voltage distribution chart for an exemplary array of non-volatile memory ("NVM") cells, wherein the cell are grouped into segments/blocks.
Figure 2A:
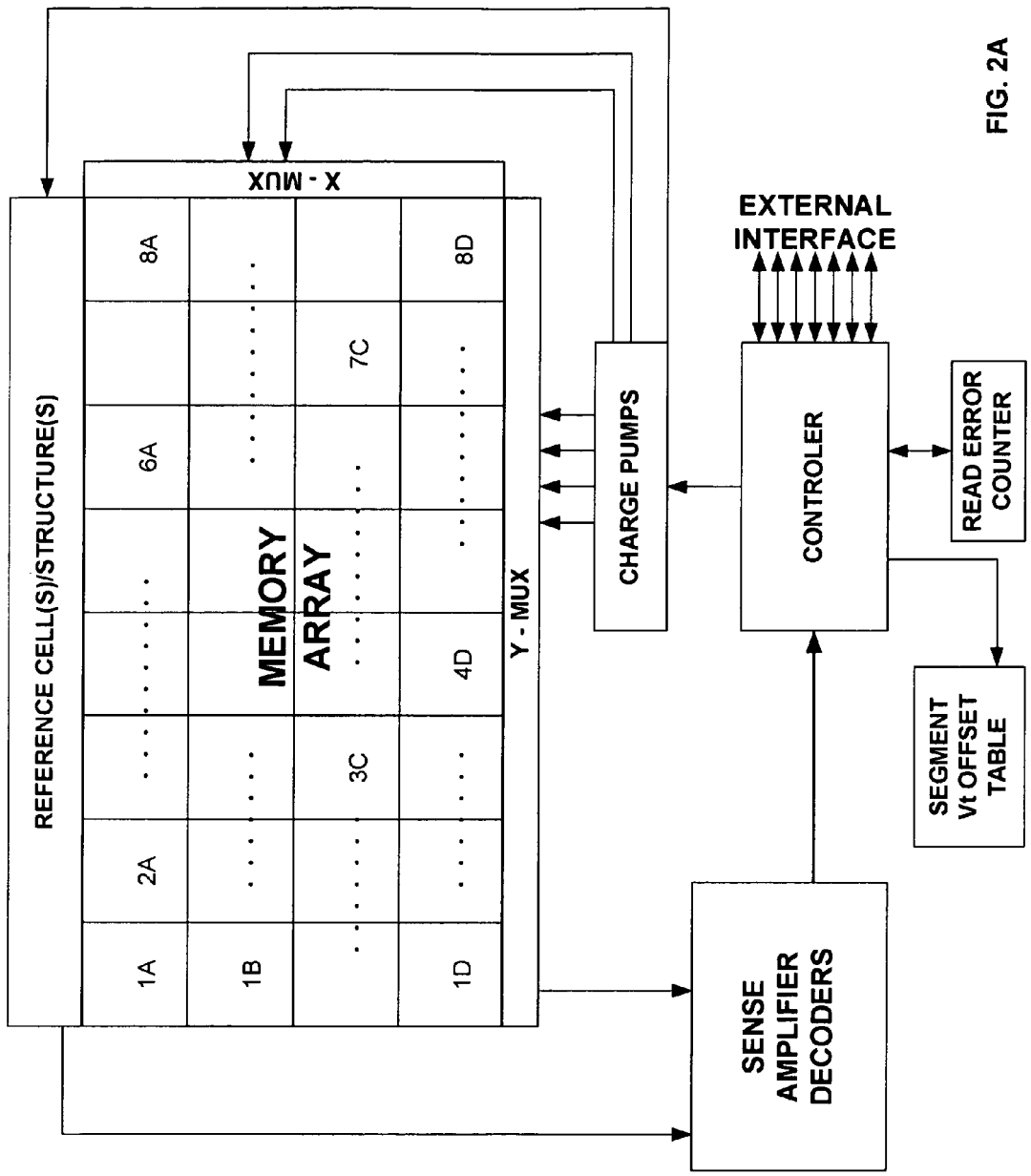
FIG. 2A is an exemplary block diagram of a NVM device according to some embodiments of the present invention, wherein control logic (e.g. controller) is adapted to read substantially native state NVM cells in one or more segments/blocks of the NVM array and to populate a Vt offset table with one or more Vt offset entries for each read segments/block based on the native cell reading.
Figure 2B:
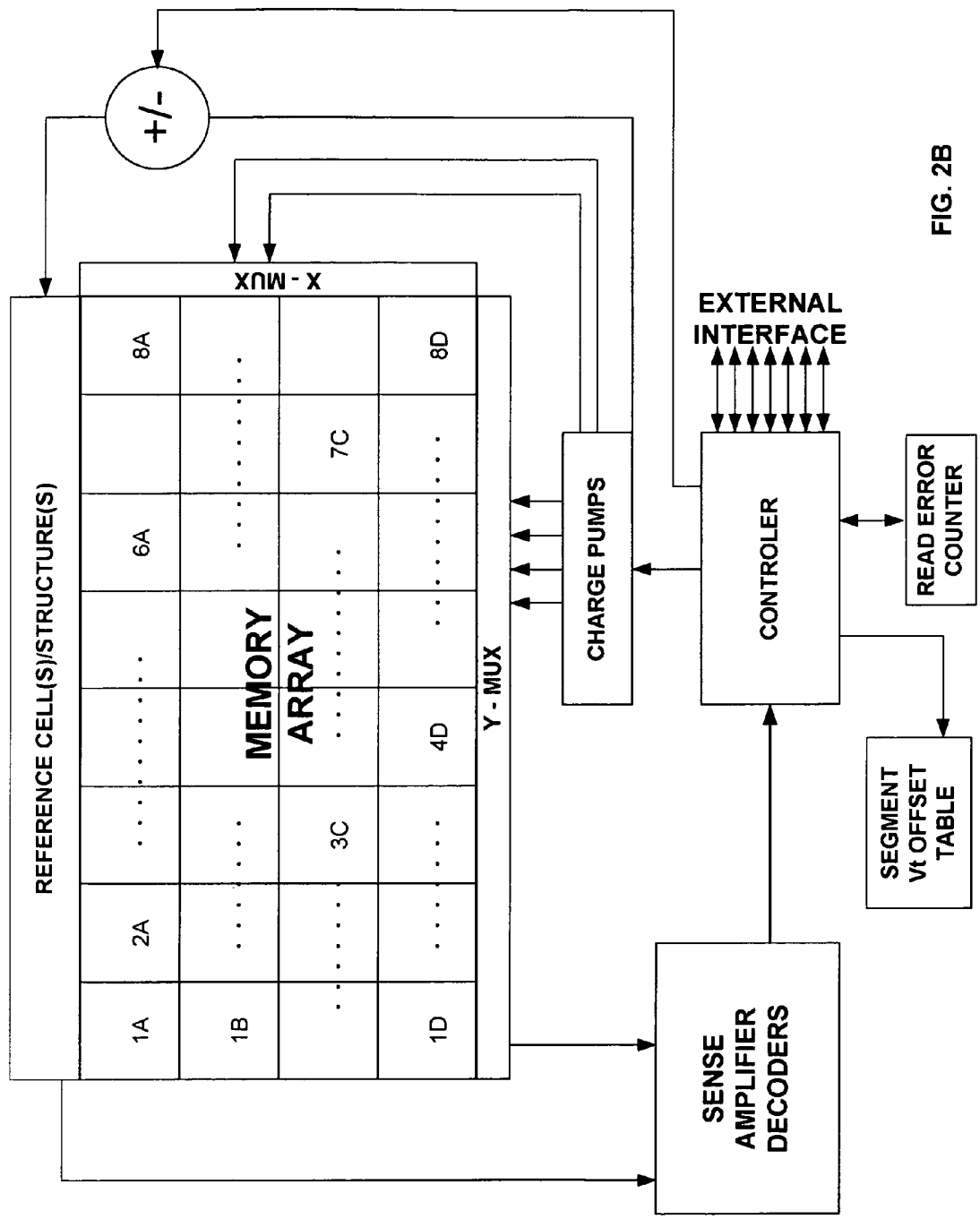
FIG. 2B is another exemplary block diagram of a NVM device according to further embodiments of the present invention, wherein control logic (e.g. controller) is adapted to read substantially native state NVM cells in one or more segments/blocks, using a voltage offset circuit on the reference cell/structure wordline, and to populate a Vt offset table with one or more Vt offset entries for each read segments/block based on the native cell reading.
Figure 2C:
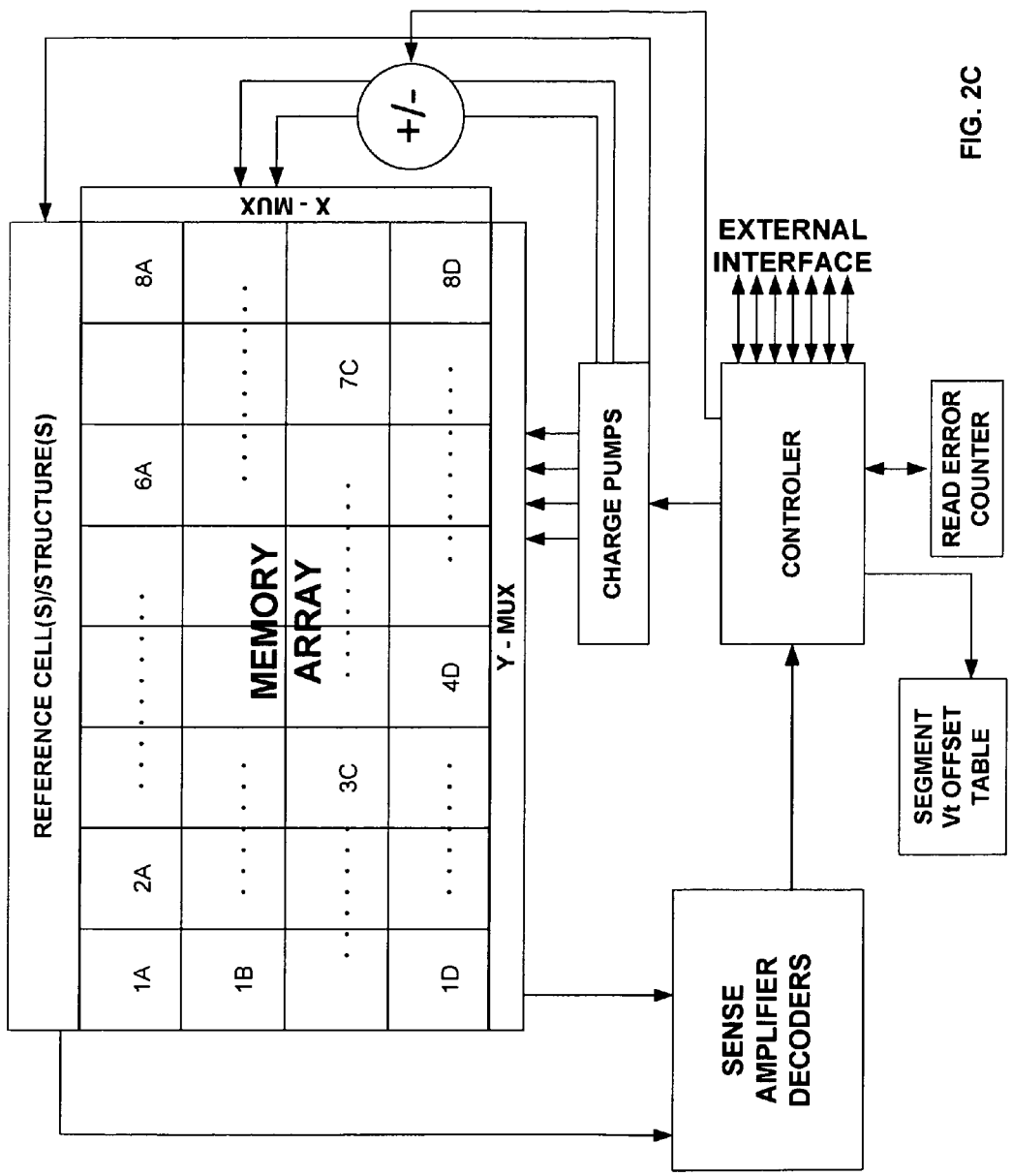
FIG. 2C is another exemplary block diagram of a NVM device according to further embodiments of the present invention, wherein control logic (e.g. controller) is adapted to read substantially native state NVM cells in one or more segments/blocks, using a voltage offset circuit on the NVM cell wordline, and to populate a Vt offset table with one or more Vt offset entries for each read segments/block based on the native cell reading.
Figure 3A:
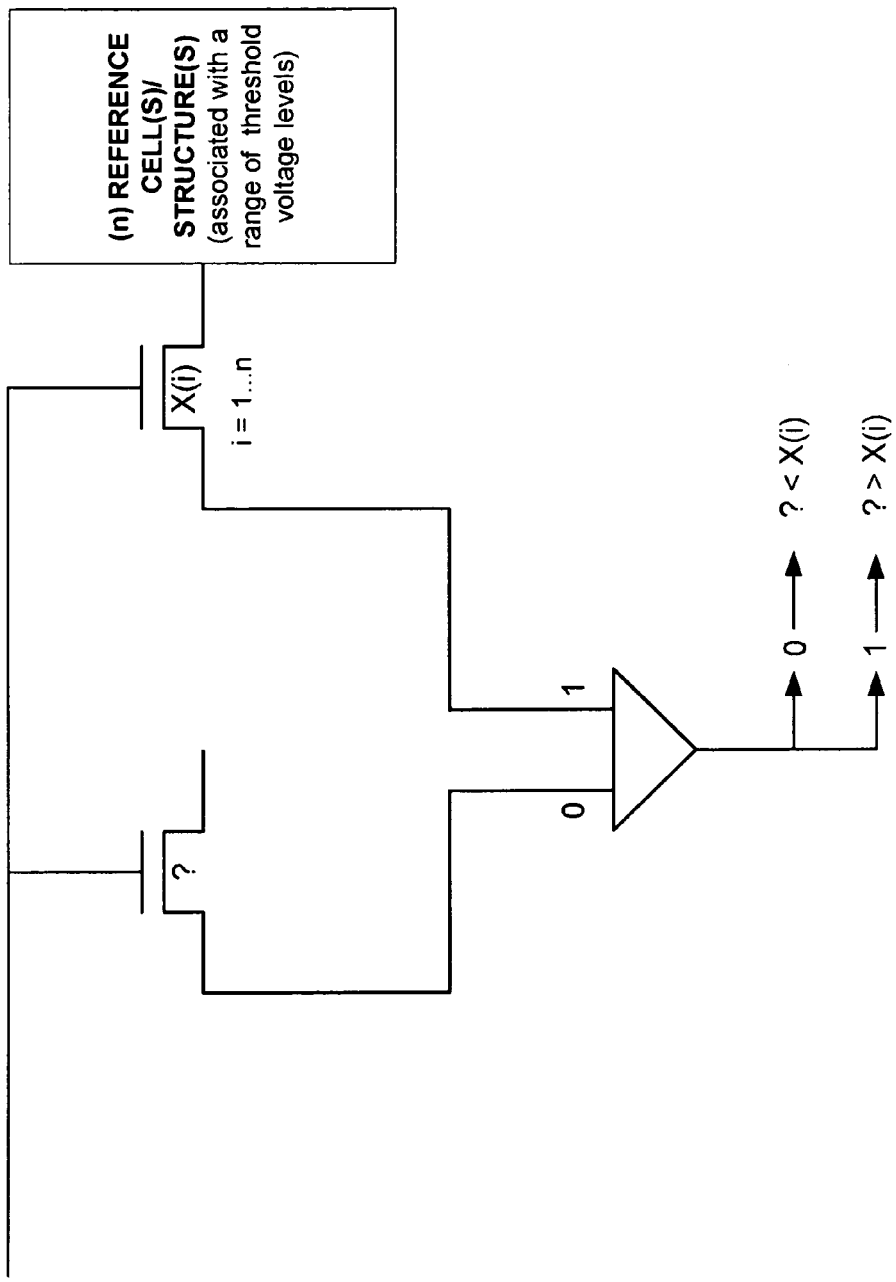
FIG. 3A shows a block diagram of an NVM sensing circuit segment using a set of n reference cells/structures associated with a range of threshold voltage levels, in accordance with some embodiments of the present invention.
Figure 3B:
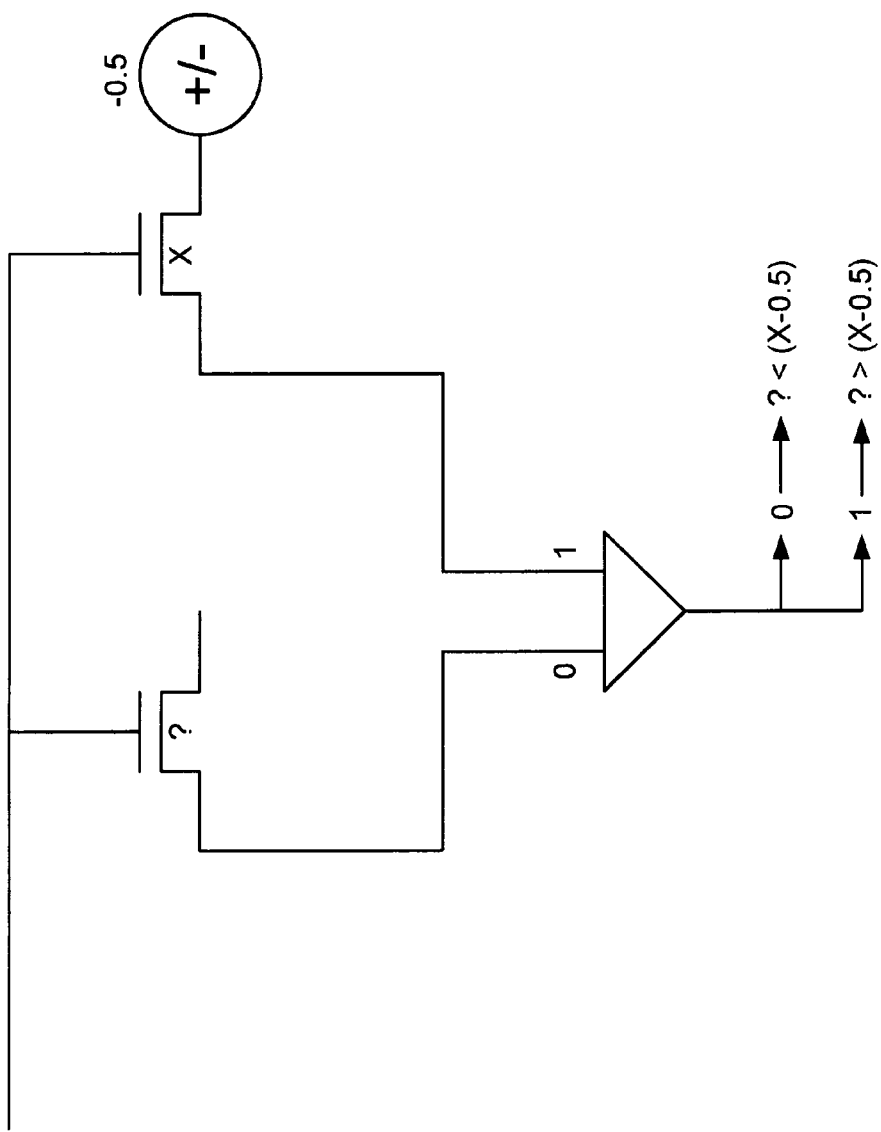
FIG. 3B shows a block diagram of an NVM sensing circuit segment using a wordline Vt offset circuit on the reference cell/structure wordline in accordance with some embodiments of the present invention.
Figure 3C:
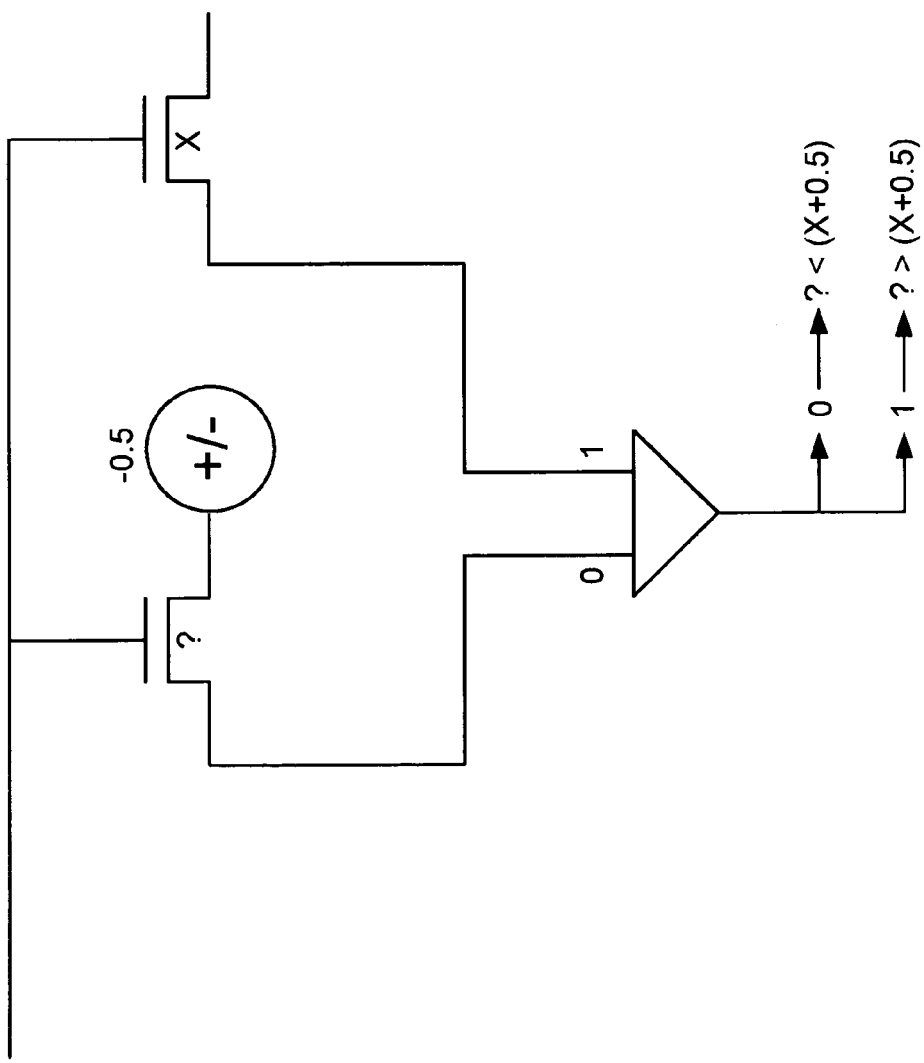
FIG. 3C shows a block diagram of an NVM sensing circuit segment using a wordline Vt offset circuit on the NVM data cell wordline in accordance with some embodiments of the present invention.
Figure 4:
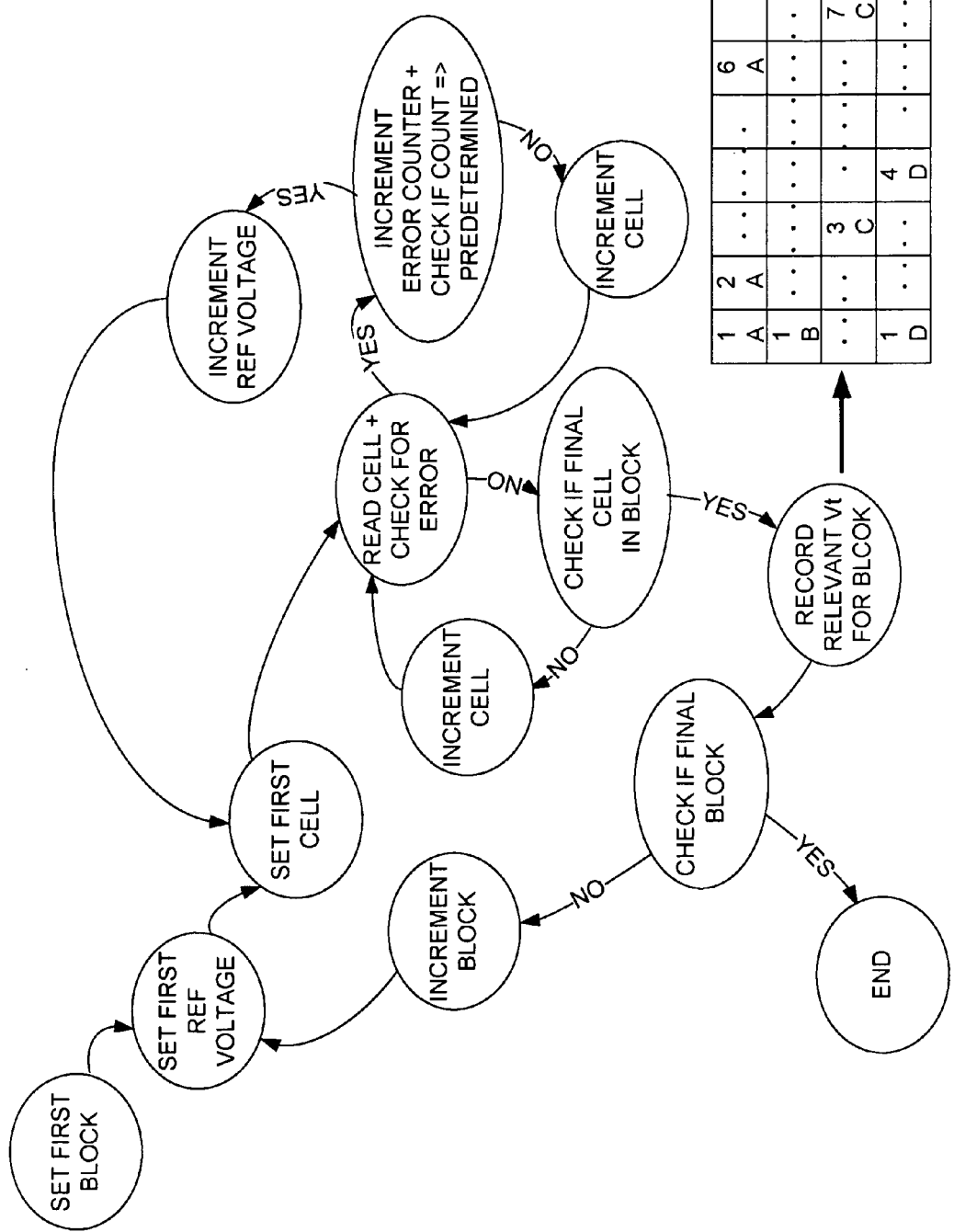
FIG. 4 is a symbolic state diagram illustrating an exemplary state flow of: (1) reading substantially native state NVM cells in two or more segments/blocks, (2) for each segment/block counting read error rates associated with different reference voltage threshold values, and (3) populating an offset table with entries for each segment/block, in accordance with some embodiments of the present invention.
Figure 5A:
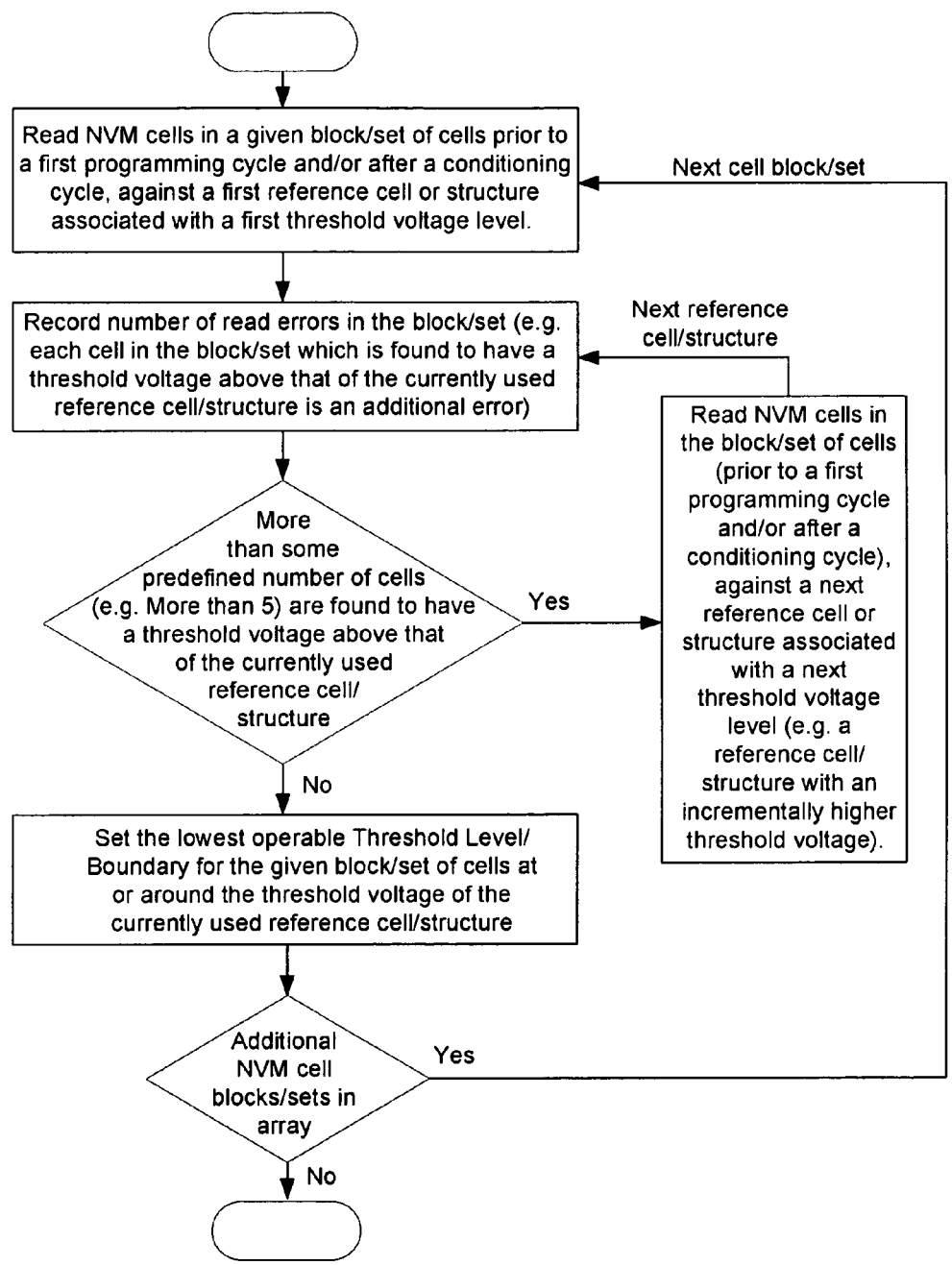
FIGS. 5A-5C are flow charts including steps of exemplary methods of reading substantially native state NVM cells and compiling Vt offset tables in accordance with embodiments of the present invention, wherein each of the flow charts corresponds with a respective block diagram shown in FIGS. 2A-2C.
Figure 5B:
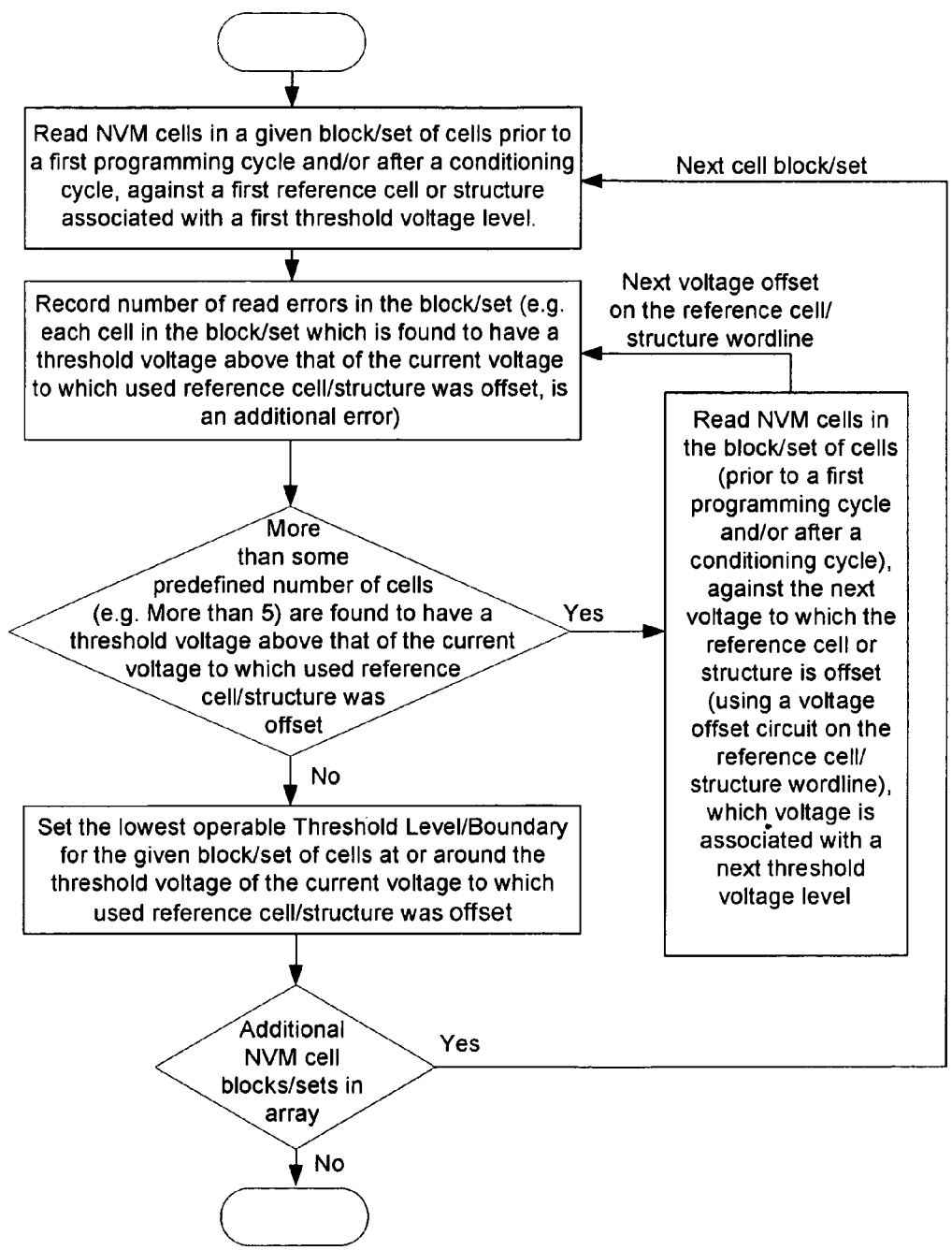
Figure 5C:
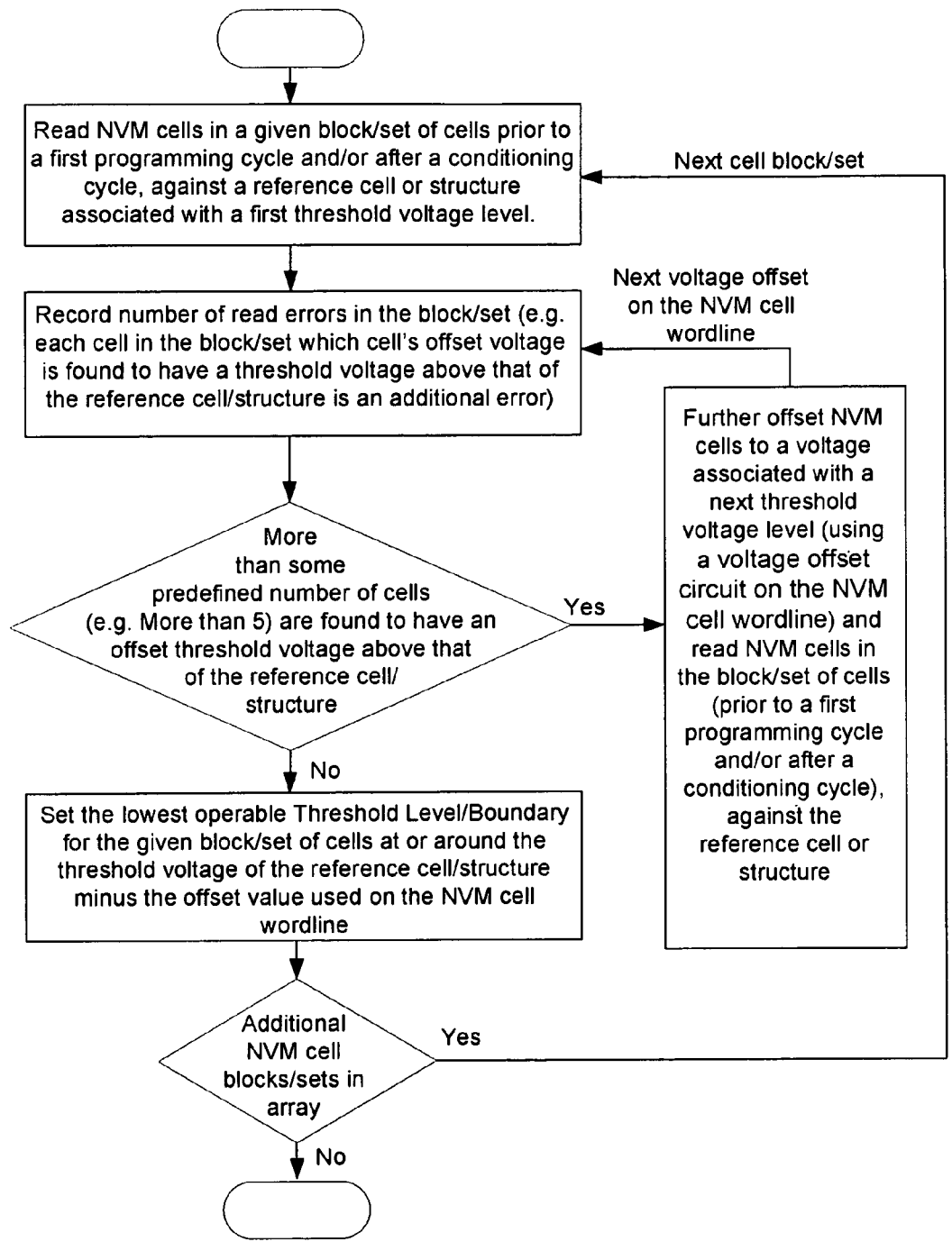
Figure 6A:
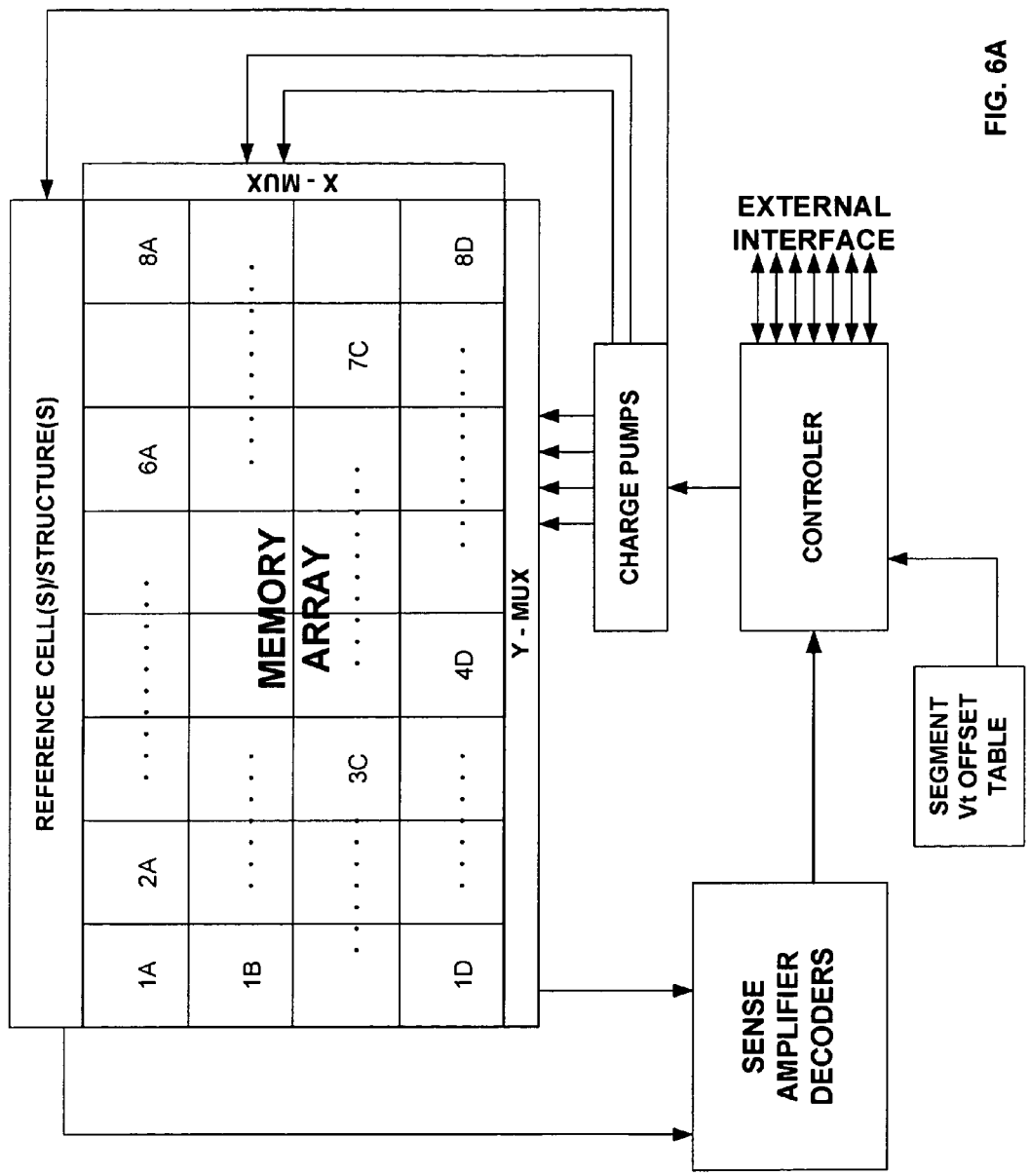
FIGS. 6A-6C are block diagrams of exemplary NVM devices which may be operated to read programmed NVM cells utilizing entries in a Vt offset table compiled in accordance with some embodiments of the present invention.
Figure 6B:
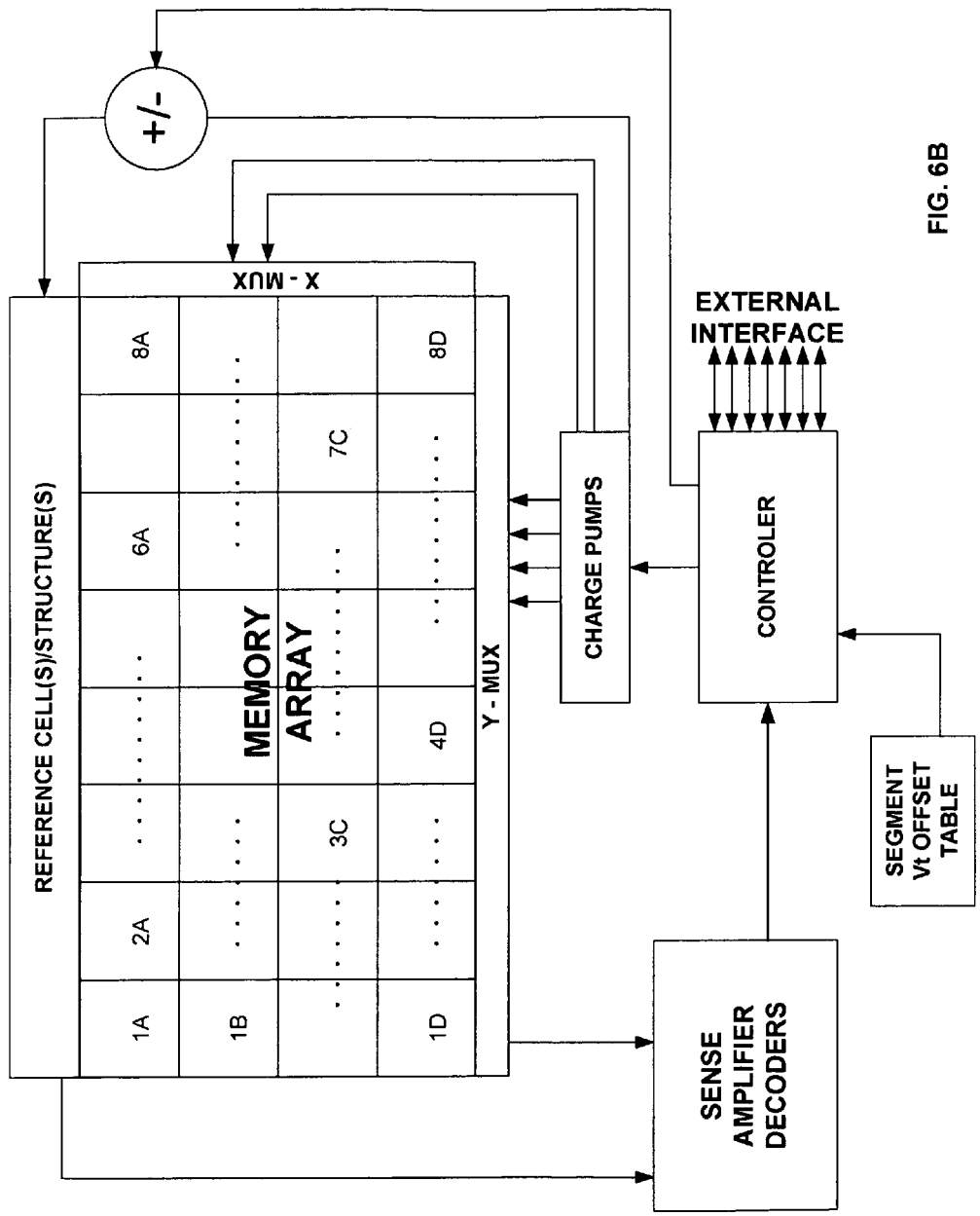
Figure 6C:
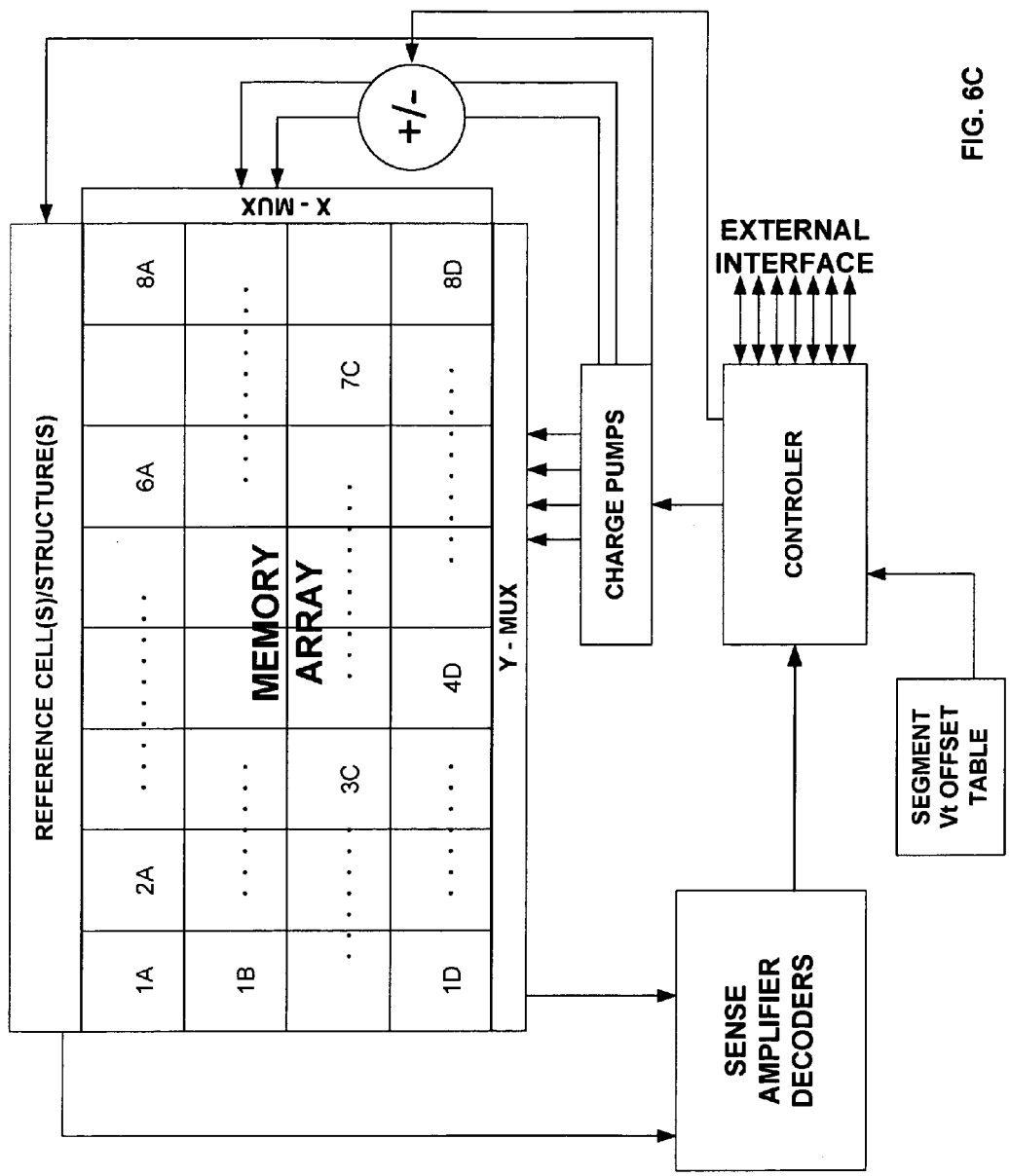
Figure 7:
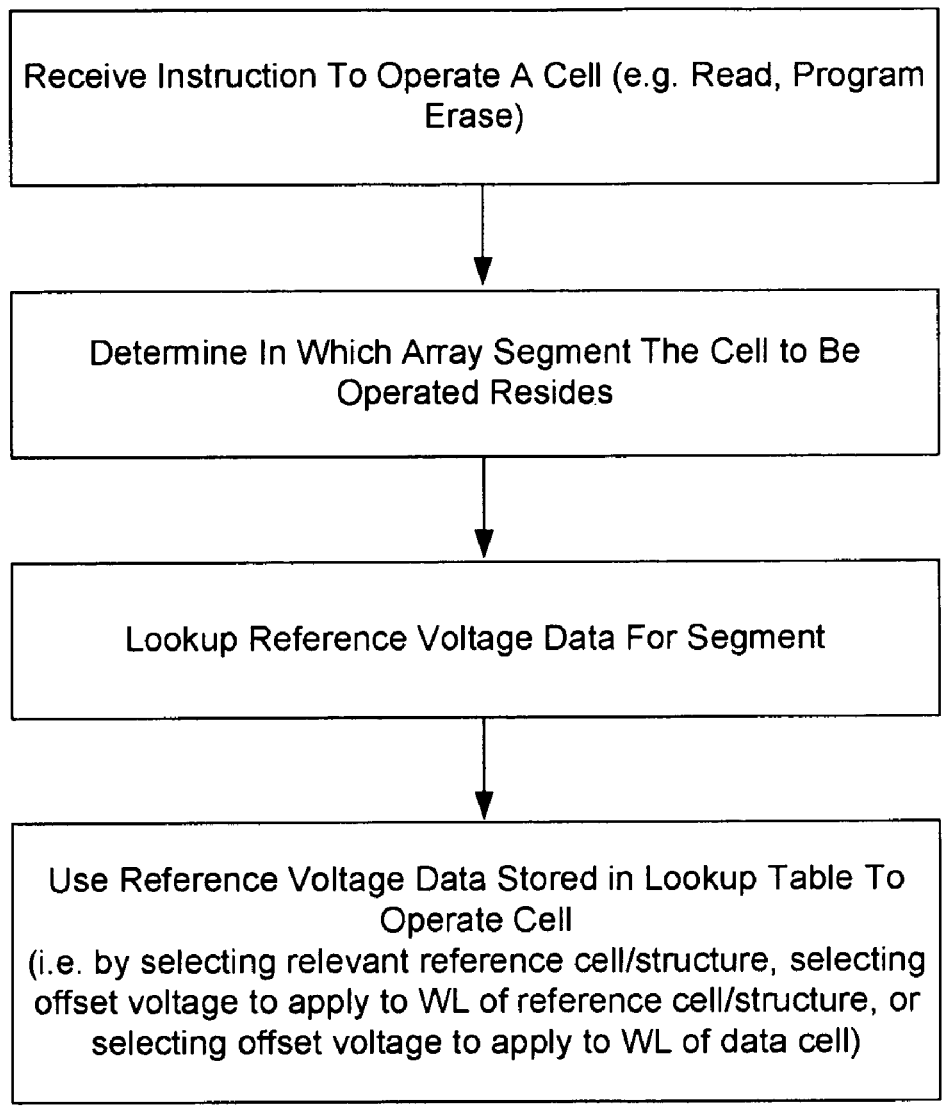
FIG. 7 is a flow chart including steps of an exemplary method of operating an exemplary NVM device to read programmed NVM cells utilizing entries in a Vt offset table compiled in accordance with some embodiments of the present invention.
Figure 8A:
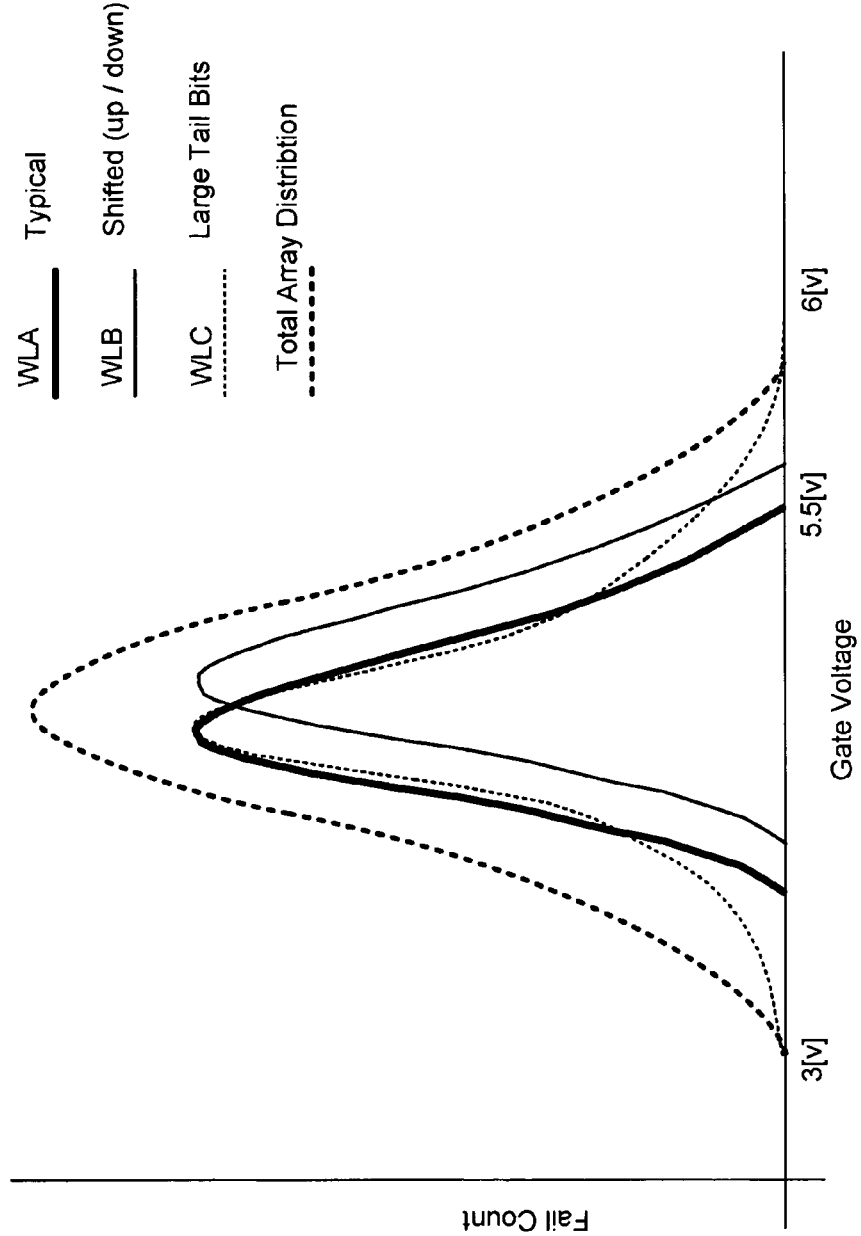
FIG. 8A is a Vt Distribution graph showing exemplary native segment/block of cells in a NVM memory array, divided into three typical groups, in accordance with some embodiments of the present invention.
Figure 8B:
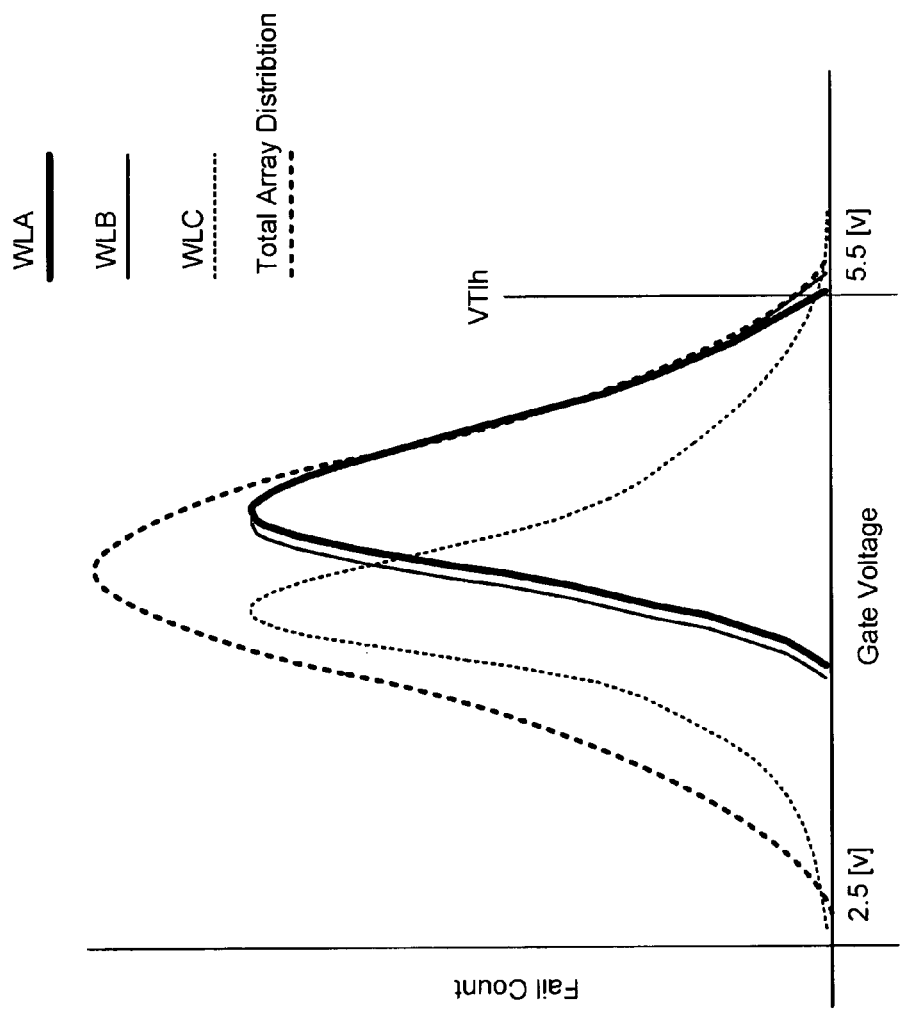
FIG. 8B is a Vt Distribution graph showing an exemplary segment/block of cells, wherein all block cells are aligned to a ref point [VTIh] by the application of offset gate/reference voltage while maintaining a predefined fail count level, in accordance with some embodiments of the present invention.
Figure 8C:
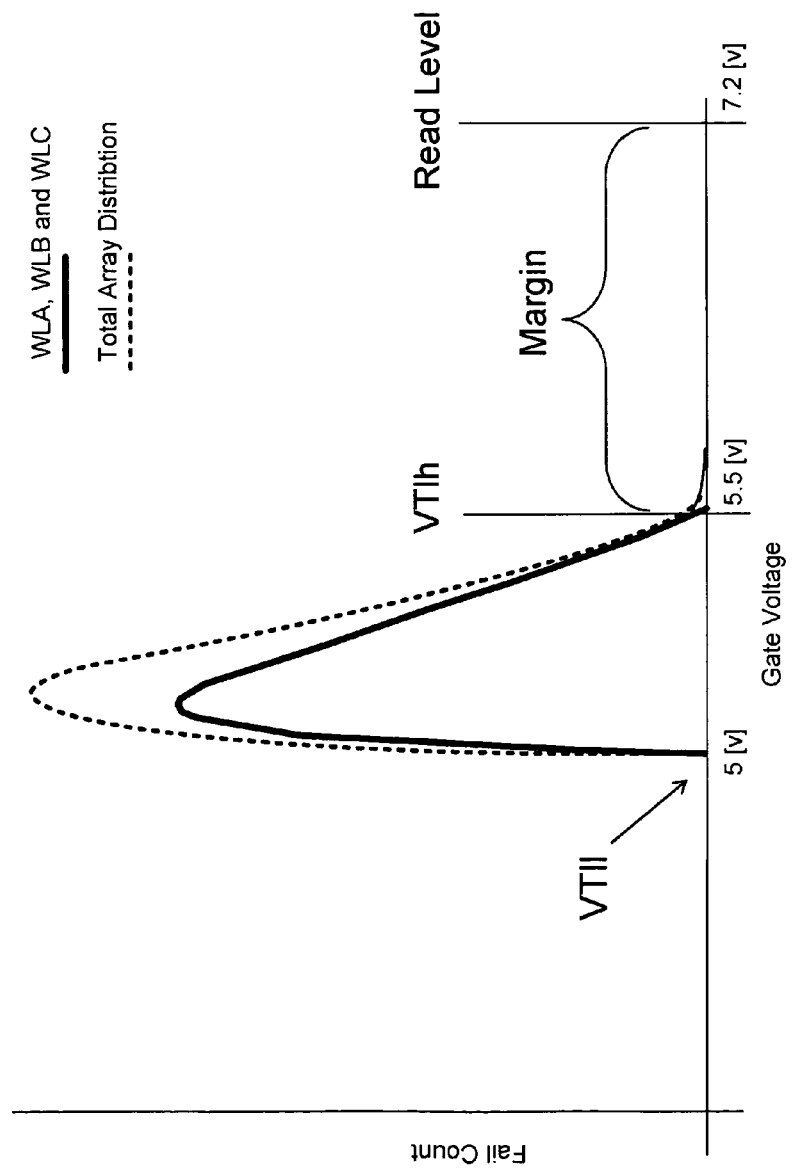
FIG. 8C is a Vt Distribution graph showing an exemplary segment/block of cells, wherein all block cells are programmed to a minimum threshold level [VTII] of 5[V] and all block cells maintain the same margin, in accordance with some embodiments of the present invention.
Figure 8D:
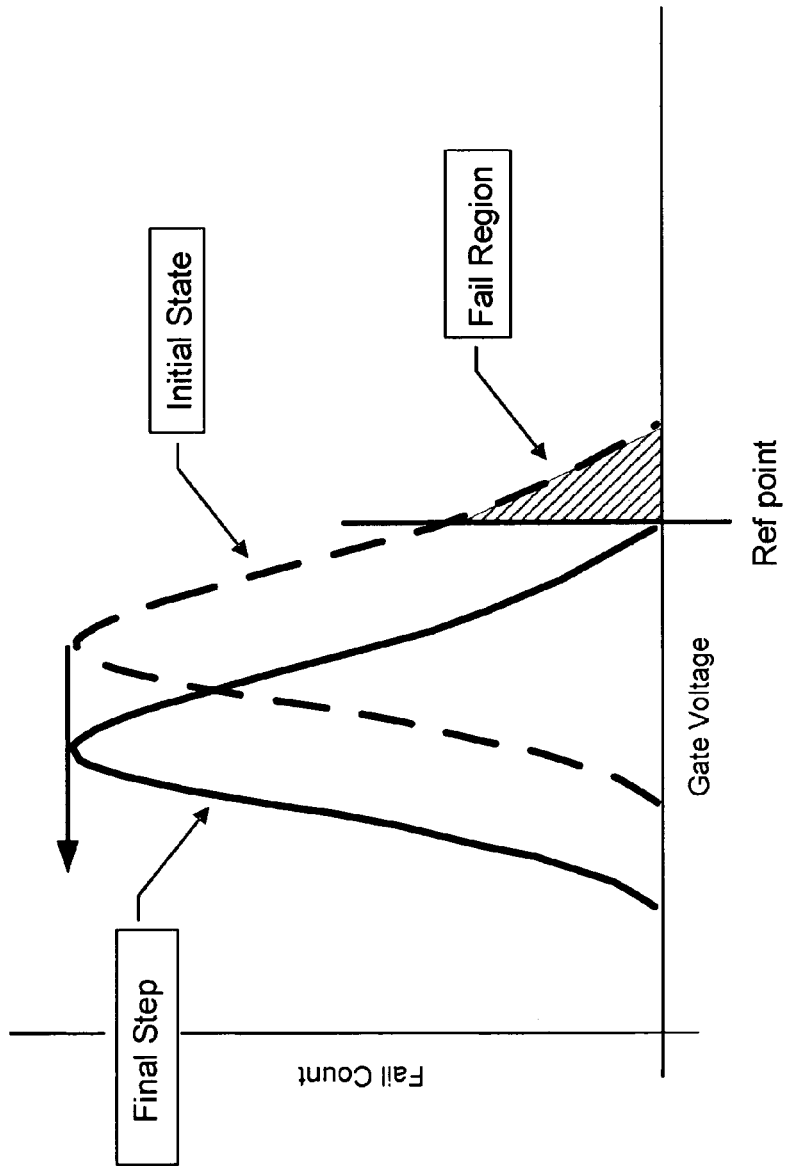
FIG. 8D is a Vt Distribution graph showing an exemplary segment/block of cells, wherein offset voltage of block cells has been calculated to maintain a predefined fail count threshold, in accordance with some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

The present invention is a method circuit and system for operating an array of non-volatile memory ("NVM") cells. According to some embodiments of the present invention, a Lowest Operative Threshold Voltage Level (i.e. threshold voltage level/boundary associated with a logical state defined by the lowest threshold voltage from a set of threshold voltages associated with logical states) may be determined for one or more of a set of non-volatile memory cell blocks (i.e. NVM cell segments or NVM cell groups, or NVM cell sets). An NVM array according to some embodiments of the present invention may be partitioned into NVM blocks, and some or all of the blocks may be associated with a lowest operative threshold voltage, which lowest operative threshold voltage for a given block may be correlated with (e.g. at or near) the highest native threshold voltage found for an NVM cell of the given block.

According to some embodiments of the present invention, there is provided a circuit method and system of determining Threshold Voltage Level Boundaries between logical states of NVM cells within a block or set of NVM cells. An NVM array according to some embodiments of the present invention may be functionally associated with a controller or control logic (e.g. on the same die), and the controller or control logic may be functionally associated with (e.g. integral with) a testing circuit adapted to determine a Lowest Operative Threshold Voltage Level for one or more blocks of the array. The testing circuit may be adapted to determine a lowest operative threshold voltage level for a given block of cells by executing an iterative cell reading process including read error counting. According to further embodiments of the present invention, a lowest operable Threshold Level/Boundary may be correlative to a native threshold voltage distribution for the block or set of NVM cells. For example, the lowest operable Threshold Level/Boundary may be set in proximity with (e.g. slightly below, at, or slightly above) the threshold voltage of the NVM cell in the block or set having the highest native threshold voltage. Thus, the circuit may determine or estimate the highest native threshold voltage for a given block.

According to some embodiments of the present invention, the lowest operable Threshold Level/Boundary may be determined by reading NVM cells in the block/set of cells prior to a first programming cycle and/or after a conditioning cycle. Some or all of the cells in the block/set may be read against at least a first reference cell or structure associated with a first threshold voltage level. The first reference cell or structure may be part of a set of reference cells or structures, wherein each reference cell or structure in the set is associated with a different threshold voltage. Alternatively, the first reference cell/structure may be designed to have an adjustable threshold voltage.

A read error count may be maintained as NVM cells from the block/set of cells are read against a given reference cell/structure associated with a given threshold voltage. If, for example, the NVM cells are assumed to be at a threshold voltage level below that of the threshold voltage level of the reference cell/structure against which they are being read, for each cell in the block/set which is found to have a threshold voltage above that of the reference cell/structure (e.g. cell starts conducting after the reference cell/structure starts conducting), a read error may be recorded. If, on the other hand, the NVM cells are assumed to be at a threshold voltage level above that of the threshold voltage level of the reference cell/structure against which they are being read, for each cell in the block/set which is found to have a threshold voltage below that of the reference cell/structure (e.g. cell starts conducting before the reference cell/structure starts conducting), a read error may be recorded.

Comparing some or all of the NVM cells in a given block/set of cells, while they are in a native or conditioned state, against different reference cells/structures, coupled with a read error count, may be used to estimate or determine a lowest operable Threshold Level/Boundary for a given cell block/set. According to some embodiments of the present invention, NVM cells in the given block/set of cells may be first compared/read against a first reference cell structure having the lowest threshold voltage level from all possible threshold voltages associated with a set of reference cells, or the lowest threshold voltage achievable with an adjustable reference cell/structure. If less than some predefined number of cells (e.g. less than 5) are found to have a threshold voltage above that of the first reference cell/structure, the lowest operable Threshold Level/Boundary for that given block/set of cells may be correlated to (set at or around) the threshold voltage of the first reference structure. If, on the other hand, more than some predefined number of cells (e.g. 5 cells) from the block of cells are found to have a higher threshold voltage than the first reference cell/structure (i.e. read error count is at or above 5), the comparison/reading of NVM cells against the first reference cell/structure may be terminated, and a reference cell/structure with an incrementally higher threshold voltage may be selected for comparison reading. Alternatively, each of the blocks may use different voltage conditions for sensing. The process of comparing, error checking and incrementing reference structures (e.g. from lowest threshold voltage to highest threshold voltage) may be iterated until a reference cell/structure which results in an acceptable number of read errors (e.g. 5) is identified—and the threshold voltage of the identified reference cell/structure may be used to select the lowest operable Threshold Level/Boundary for the given cell block/set.

It should be clear to one of skill in the art that the above recited sequence of steps to estimate/determine a lowest operable Threshold Level/Boundary for the given cell block/set may be inverted or modified without derogating from the present invention. For example, the first reference cell/structure may be the one with the highest threshold voltage level (from a set of reference cell/structure/levels) and a read error may defined as the NVM cell having a lower threshold voltage level than the reference cell/structure. Thus, during a first read sequence with the first reference cell/structure, the reading of substantially all the NVM cells should result in a read error. The reading, error counting and downward incremental iteration of reference cells (threshold voltage) may continue until a reading of all the cells in the block/set of cells, against a specific reference cell/structure/level, results in less than some predefined number or range of errors (e.g. 5 to 8). As in the above described scenario, the threshold voltage of the specific cell/structure/level may be correlated to a lowest operable Threshold Level/Boundary for the given cell block/set by adjustable voltage conditions. Various other permutations of cell reading steps, read error definitions, and predefined read error conditions may be used as part of some embodiments of the present invention.

According to some embodiments of the present invention, a logic circuit functionally associated with and/or allocated on the same die as the NVM array may be adapted to perform the above recited sets of operations, or any derivation thereof, in order to estimate or determine a lowest operable Threshold Level/Boundary for a given cell block/set within the array. The reference cells/structures used may also be functionally associated with and/or allocated on the same die as the array. Once a lowest operable Threshold Level/Boundary for a given cell block/set is determined, other logical state voltage threshold levels for the reading of cells within the given block/set may be set relative to the lowest operable Threshold Level/Boundary. For example, if the Threshold Level/Boundary of the native state for a given block is set at 8.1V, a first programmed state read verify threshold voltage level for the given block may be set at 7.2V, and a second programmer state read verify level for the same block may be set at 6.6V, etc.

According to some embodiments of the present invention, reference threshold voltage levels for a given block or segment may be stored in a table functionally associated with the NVM array. According to some embodiments of the present invention, NVM cells of an array may be tested to determine a native threshold voltage distribution across the array and, if so desired or required, across array segments. A lowest reference voltage level for each array segment or block may be determined, where the lowest reference voltage level may be used to test or verify the logical state of the NVM cells associated with the lowest threshold voltage (e.g. native state). The lowest reference voltage for each segment may be determined to be equal to or greater or lower than the highest native threshold voltage of any cell within the given array segment.

As part of the present invention, the lowest reference voltage determined for each segment may be stored in a reference voltage table associated with the NVM array. According to some embodiments of the present invention, other segment-specific reference voltage levels may be stored in a "reference voltage table", such that the table may contain entries with values correlated to, or associated with, reference voltage levels associated with each array segment. The reference voltage levels correlated to, or associated with, a given array segment may be, for example, program verify voltage level for that segment, read verify voltage level for that segment, etc. That is, the table may contain one or more entries for each one of a plurality of array segments, where the one or more entries per array segment may be correlated to one or more reference voltages to be used with operating (e.g. reading cells) the given segment.

According to some embodiments of the present invention, an entry in a reference voltage table may indicate the absolute reference voltage associated with a specific logical state of a specific array segment (e.g. native verify reference voltage for segment 1D=8.1V). In some other embodiments of the present invention, an entry in the table may indicate an offset value between a global reference voltage and a local reference voltage associated with a specific logical state of a specific array segment. For example, if a global verify reference voltage level is set to, or selected to be, 7.2V, but the verify reference voltage level (being the "local' reference voltage") for segment 1D has been determined to be 7.5V, the table entry associated with an erase verify reference voltage for segment 1D may indicate an offset voltage of 0.3V.

As part of the present invention, a NVM cell within an array of NVM cells may be operated using an entry in a reference voltage table associated with the array. When attempting to verify a logical state of a NVM cell in a specific array segment, a table entry associated with the given logical state, within the given array segment, may be read. The entry may be correlated to a reference voltage associated with the given logical state in the given array segment. The entry may either indicate a specific reference voltage associated with the given logical state within the given array segment, or the entry may indicate an offset value between a global reference voltage and a local reference voltage associated with the given logical state of cells in the given array segment. For example, if a global reference voltage level is set to 7.2V, but the erase verify voltage level for segment 1D has been determined to be 7.5V, the table entry associated with an erase verify reference voltage for segment 1D may indicate an offset voltage value of 0.3V.

According to some embodiments of the present invention, an electric circuit may provide an electric signal having a voltage, or current, level to operate either a NVM cell in an NVM array or to operate a reference cell associated with the array, or a segment thereof, wherein the provided voltage, or current, level may be correlated to an entry in the table. According to some embodiments of the present invention, the electric circuit may be an input offset circuit which may offset a voltage, or current, level of a signal provided by a charge pump or by other power supply circuit. In some embodiments of the present invention, the electric circuit may be part of a charge pump or part of another power supply circuit. The electric circuit may be used to either supply a signal to NVM cells in an NVM array or to reference cells associated with the NVM array or selected segments thereof.

According to some embodiments of the present invention, the global reference cells may include multiple sets of reference cells, wherein, according to some aspects, each set of the multiple sets of reference cells may be used for operating a different memory array segment. According to other aspects, each set of the multiple sets of reference cells may be used for operating a different state of memory array cells. Alternatively, a single set of reference cells may be used for operating the entire array.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. An NVM device comprising:
an array of NVM cells, including blocks of NVM cells; and
a control logic adapted to compare substantially native state NVM cells in a block of cells against a first on-die reference structure having a first reference threshold voltage and to maintain a read error count based on the comparison and to determine a block lowest operable threshold voltage for said block and to store an offset voltage to be applied to a word-line in said block so as to compensate between a global reference threshold level and said block lowest operable threshold voltage.

2. The device according to claim 1, wherein:
the control logic is further adapted to compare substantially native state NVM cells in the block of cells against a second on-die reference structure and to maintain a read error count based on the comparison.

3. The device according to claim 2 wherein:
the first and the second on-die reference structures are associated with substantially dissimilar threshold voltages.

4. The device according to claim 3 wherein:
the second on-die reference structure is associated with a threshold voltage incrementally higher than a threshold voltage of the first on-die reference structure.

5. The device according to claim 4, wherein said control logic is further adapted to terminate a comparison against a first on-die reference structure, and initiate a comparison against a second on-die reference structure upon the read error count reaching a predefined number.

6. The device according to claim 5, wherein said control logic is further adapted to set a lowest operable threshold voltage level for the block of cells at or near the threshold voltage of a reference structure resulting in an error count which is at or below the predefined number.

7. The device according to claim 6, wherein said control logic is further adapted to set one or more logical state threshold voltage levels based on the lowest operable threshold voltage level.

8. A method for operating an NVM array comprising:
comparing substantially native state NVM cells in a block of cells against a first on-die reference structure;
determining a block lowest operable threshold voltage;
storing an offset voltage to be applied to a word-line in said block so as to compensate between a global reference threshold level and said block lowest operable threshold voltage; and
maintaining a read error count based on the comparison.

9. The method according to claim 8, wherein comparing further comprises:
comparing substantially native state NVM cells in the block of cells against a second on-die reference structure; and
maintaining a read error count based on the comparison.

10. The method according to claim 9 wherein comparing further comprises:
comparing to the first on-die reference structure having a first threshold voltage and to the second on-die reference structure having a substantially dissimilar threshold voltage.

11. The method according to claim 10 wherein comparing further comprises:
comparing to the first on-die reference structure having a first threshold voltage and to the second on-die reference structure having an incrementally higher threshold voltage.

12. The method according to claim 11, further comprising:
terminating a comparison against a first on-die reference structure; and
initiating a comparison against a second on-die reference structure upon the read error count reaching a predefined number.

13. The method according to claim 12, further comprising:
setting the lowest operable threshold voltage level for the block of cells at or near the threshold voltage of a reference structure resulting in an error count which is at or below the predefined number.

14. The method according to claim 13 wherein setting further comprises:
setting one or more logical state threshold voltage levels based on the lowest operable threshold voltage.

15. An NVM circuit comprising:
one or more charge pumps and one or more sense amplifiers adapted to operate upon blocks of NVM cells; and
a control logic adapted to compare substantially native state NVM cells in a block of cells against a first on-die reference structure and to maintain a read error count based on the comparison and to determine a block lowest operable threshold voltage for said block and to store an offset voltage to be applied to a word-line in said block so as to compensate between a global reference threshold level and said block lowest operable threshold voltage.

16. The circuit according to claim 15, wherein:
the control logic is further adapted to compare substantially native state NVM cells in the block of cells against a second on-die reference structure and to maintain a read error count based on the comparison.

17. The circuit according to claim 16 wherein:
the first and the second on-die reference structures are associated with substantially dissimilar threshold voltages.

18. The circuit according to claim 17 wherein:
the second on-die reference structure is associated with a threshold voltage incrementally higher than a threshold voltage of the first on-die reference structure.

19. The circuit according to claim 18, wherein said control logic is further adapted to terminate a comparison against a first on-die reference structure, and initiate a comparison against a second on-die reference structure upon the read error count reaching a predefined number.

20. The circuit according to claim 19, wherein said control logic is further adapted to set a lowest operable threshold voltage level for the block of cells at or near the threshold voltage of a reference structure resulting in an error count which is at or below the predefined number.

21. The circuit according to claim 20, wherein said control logic is further adapted to set one or more logical state threshold voltage levels based on the lowest operable threshold voltage level.

* * * * *